United States Patent [19]

Brokaw

[11] 4,029,974

[45] June 14, 1977

[54] APPARATUS FOR GENERATING A CURRENT VARYING WITH TEMPERATURE

[75] Inventor: Adrian Paul Brokaw, Burlington, Mass.

[73] Assignee: Analog Devices, Inc., Norwood, Mass.

[22] Filed: Nov. 13, 1975

[21] Appl. No.: 631,844

Related U.S. Application Data

[62] Division of Ser. No. 560,954, March 21, 1975, Pat. No. 3,940,760.

[52] U.S. Cl. .......................... 307/296 R; 307/297; 307/310; 307/299 A; 323/9
[51] Int. Cl.² .................... H03K 1/00; H01V 3/00; H01L 35/00
[58] Field of Search .................. 307/310, 296, 235; 323/1, 4, 9; 340/347 AD, 347 DA

[56] References Cited

UNITED STATES PATENTS

| | | |
|---|---|---|
| 3,766,543 | 10/1973 | Winkel et al. .............. 340/347 DA |
| 3,842,412 | 10/1974 | Spofford, Jr. .............. 340/347 DA |
| 3,911,353 | 10/1975 | dePlassche ..................... 323/1 |

Primary Examiner—Stanley D. Miller, Jr.
Assistant Examiner—B. P. Davis

Attorney, Agent, or Firm—Parmelee, Johnson & Bollinger

[57] ABSTRACT

A digital-to-analog converter of the type formed with a plurality of current source transistors arranged to carry different levels of current according to a predetermined weighting pattern, e.g., a binary weighting pattern. In the converter, a plurality of identically sized current source transistors carry the different levels of current and thus operate at different current densities with different base-to-emitter voltages subject to temperature drift. Stable emitter voltages, providing accurate levels of weighted current, are developed by means of resistances between the bases of successive current source transistors and a current source for developing across the interbase resistances a voltage linearly varying with absolute temperature, corresponding to the difference between base-to-emitter voltages of the successive current source transistors.

The apparatus for generating a current linearly varying with absolute temperature is formed with first and second transistors forced to carry the same current at different current densities to produce different base-to-emitter voltages, and means such as an emitter resistor responsive to the difference in the base-to-emitter voltages for developing a current, corresponding to the difference in base-to-emitter voltages, which varies linearly with temperature.

12 Claims, 2 Drawing Figures

APPARATUS FOR GENERATING A CURRENT VARYING WITH TEMPERATURE

This is a division, of application Ser. No. 560,954 filed Mar. 21, 1975 now U.S. Pat. No. 3,940,760.

This application discloses and claims subject matter disclosed in applicant's prior application Ser. No. 419,616, now U.S. Pat. No. 3,887,863, and the benefit of the filing date of said application is claimed herein for all common subject matter.

BACKGROUND OF THE INVENTION

1. Field of the Invention

This invention relates to digital-to-analog converters. More particularly, this invention relates to such converters of the type formed with a plurality of current source transistors arranged to carry different levels of current according to a predetermined weighting pattern, such as a binary weighting pattern. This invention relates also to apparatuses for generating a temperature-varying current.

2. Description of the Prior Art

Digital-to-analog converters generally have comprised a plurality of transistors arranged to carry different levels of current according to a predetermined weighting pattern, with switches selectively operated by an input digital signal to combine selected currents into an analog output signal. Examples of such designs are shown in U.S. Pat. Nos. 3,685,045 and 3,747,088. In such digital-to-analog converters, the transistor current sources are connected to a current-weighting network of resistors which determines the current each transistor is to carry. These converters also use a control loop to establish the proper base voltage for a reference current transistor, and all the current source transistors are driven from this same base voltage.

In such converters it is desired to establish equal voltages at the emitters of the current source transistors, since each of the emitters than can force the appropriate weight of current in its associated resistor or in the current-weighting resistive network. If the emitter voltages are unequal, the currents associated with each bit will not be in the proper ratio. Moreover, temperature drifts in these emitter voltage differences produce temperature-dependent errors in the output. While the resistors could be trimmed to eliminate initial errors, any temperature drift cannot be so corrected.

One technique for establishing equal emitter voltages, as shown in U.S. Pat. No. 3,747,088, is to proportion the emitter areas so that all of the current source transistors operate at the same current density and thus have the same base-to-emitter voltages and temperature characteristics. Since all the current source transistors are driven with a common base voltage, the emitter voltages also will be equal, even with changes in temperature. Since the currents in such converters are ordinarily scaled with a binary weighting pattern, this means that the emitter areas must also have a binary weighting. Even taking advantage of the significant step of dividing the current sources into separate four-bit modules, commonly referred to as "quad switches", as described in U.S. Pat. No. 3,747,088, each four-bit unit requires emitter areas in the ratios of 8:4:2:1. This requires a total of 15 unit emitter areas which, in integrated circuit processing, consumes a substantial part of the total chip area.

Notwithstanding the foregoing development in the design of solid state digital-to-analog converters, there still has existed a need for converters requiring less chip area but still providing acceptable performance. One technique that has been proposed is to use current source transistors with equal emitter areas and to use a series of fixed voltage offsets between the base of the current source transistors. The fixed offsets would be chosen to approximate the base-emitter voltage difference due to the 2:1 current density ratio in successive transistors. A problem with this proposal is that the base-emitter voltage difference due to operation at different current densities is a function of absolute temperature. Accordingly, the fixed voltage offsets would provide poor temperature performance, particularly in a multiplying digital-to-analog converter where the voltage across the current source transistors may be driven to small values.

SUMMARY OF THE INVENTION

It is a principal object of this invention to provide an improved digital-to-analog converter. A more specific object of this invention is to provide such a converter which is capable of utilizing current source transistors of uniform size, and therefore operating at different current densities, yet which is capable of providing equal and stable emitter voltages and good temperature performance. Still another object of this invention is to provide good temperature performance in uniform current source transistors by means of devices which are fully compatible with the significant advances in input circuitry, output diverting circuitry, etc., which have been developed for use in digital-to-analog converters. Still another object of the invention is to provide such a converter capable of being manufactured at reasonable cost, using straightforward IC processing techniques.

In a preferred embodiment of the invention to be described hereinbelow in detail, the digital-to-analog converter, of the type formed with a plurality of current source transistors arranged to carry different levels of current according to a predetermined weighting pattern, comprises a plurality of current source transistors, typically having uniform emitter conductive areas, arranged to operate at different current densities and therefore different base-to-emitter voltages when carrying the different levels of current. Resistance means are connected between the bases of successive current source transistors, and means are provided for developing across the resistance means a voltage, varying with absolute temperature, which corresponds to the difference between base-to-emitter voltages of the successive current source transistors. The emitter voltages of the successive current source transistors then are equal and stable with respect to temperature, providing accurate levels of weighted current in the converter and accurate digital-to-analog conversion. The voltage developing means in the preferred embodiment of the invention is a current generator comprising first and second transistors with conductive areas in the same ratio, e.g. 2:1, as the ratio of current densities in the successive current source transistors, and means for forcing equal currents through the first and second transistors to produce different base-to-emitter voltages corresponding to the different current densities. A means, such as a resistor connected between the emitters of the first and second transistors and carrying the current through one of the transistors, responds to the difference in base-to-emitter voltages and develops a current which corresponds to the temperature varying difference in base-to-emitter voltages.

Other objects, aspects, and advantages of the invention will be pointed out in, or apparent from, the following description of preferred embodiments considered together with the accompanying drawings.

DESCRIPTION OF THE PREFERRED EMBODIMENTS

Figure 1:
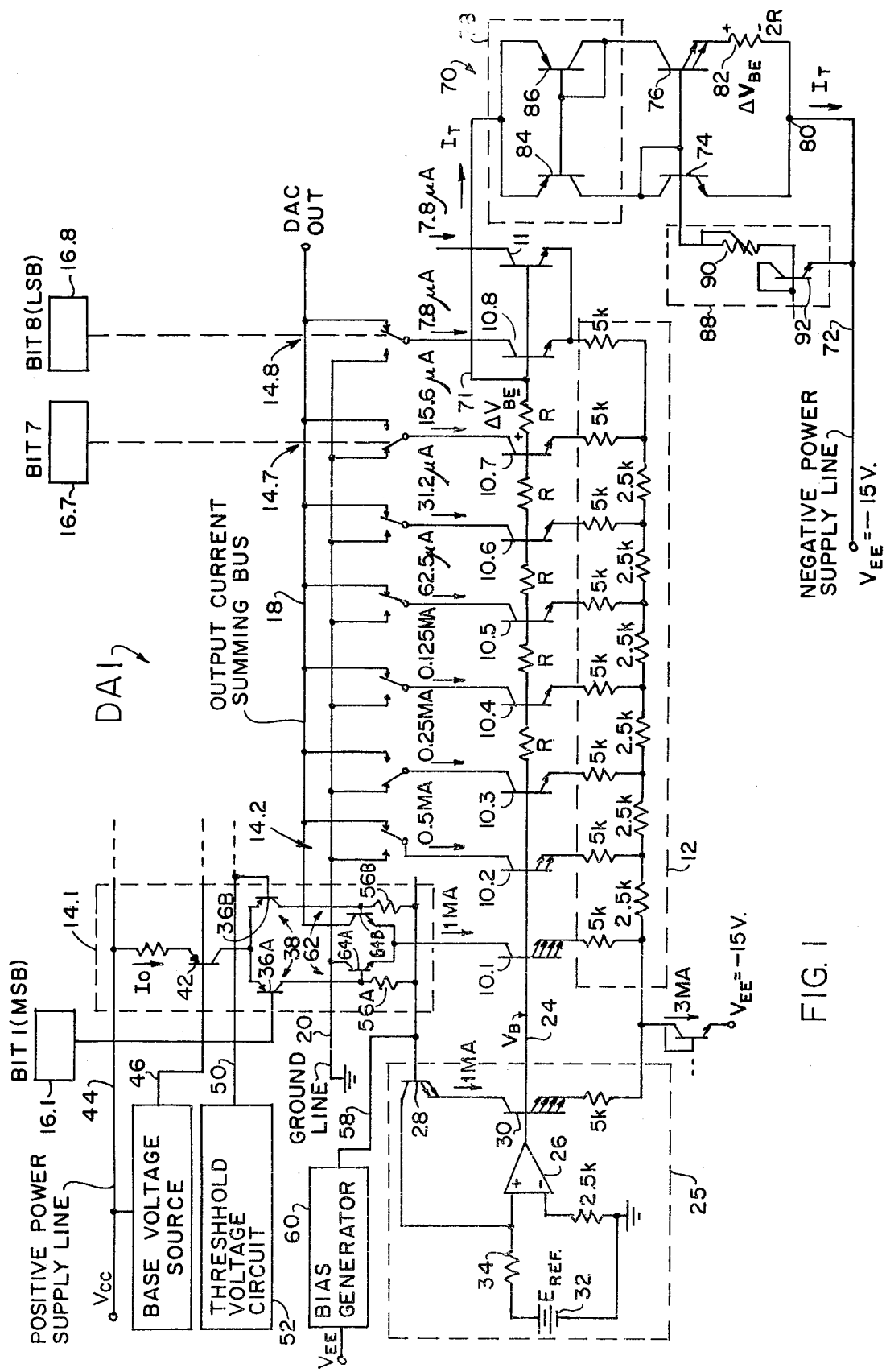
FIG. 1 is a schematic diagram of a digital-to-analog converter in accordance with the present invention.

FIG. 1 illustrates an eight-bit binary integrated circuit digital-to-analog converter DA1 in accordance with the present invention. The converter comprises a plurality of current source transistors 10.1 through 10.8 arranged to carry different levels of current according to a binary weighting pattern determined by a resistive weighting network 12 connected to the emitters of the current source transistors. The resistive weighting network 12 shown in FIG. 1 is an R-2R ladder network which sets the current level of each current source transistor in the ladder at one-half the level of the preceding current source transistor. An additional transistor 11, matched to the current level of the 8th bit current source transistor 10.8, is provided to properly terminate the R-2R network.

Associated with the current source transistors 10.1 through 10.8 are a plurality of selectively-operable, identical switching cells 14.1 through 14.8 (one of which is shown in detail), controllable by digital logic signals applied to respective logic signal input terminals 16.1 through 16.8. Each switching cell is arranged to switch the current flowing through a corresponding current source transistor, alternatively between (1) an output current summing bus 18 and (2) a ground line 20. The switching cells 14, as described in greater detail in the co-pending patent application of Robert B. Craven, Ser. No. 505,477, filed Sept. 12, 1974, entitled "Improved Solid State Digital-To-Analog Converter", advantageously provide rapid switching with a constant speed switching characteristic and supply a constant potential to the collectors of the current source transistors 10.1 through 10.8 for either switch state. Briefly, the switching cells 14 comprise a transistor 40 and a current setting resistor 42 coupled to the positive supply voltage line 44 and to a base voltage line 46 to act as a constant current source producing a current $I_o$ of 0.5MA. PNP transistors 36A and 36B form a first differential pair 38 which steers the current $I_o$ in accordance with the logic signal from input terminal 16, received at the base of transistor 36A, and in accordance with a fixed voltage received at the base of transistor 36B from threshold voltage line 50 and developed by threshold voltage circuit 52 to match the requirements of the particular logic signals (e.g. TTL or CMOS logic) which are used. The collectors of transistors 36A, 36B are connected through resistors 56A, 56B to a bias voltage line 58, the voltage of which is maintained constant by a bias generating circuit 60. A second differential pair 62 of matched transistors 64A, 64B is controlled by the voltages across resistors 56A, 56B, and the transistors in the second pair 62 are alternatively conductive, depending upon the signal input at terminal 16, to direct the current from the current source transistor 10 either to the output current summing bus 18 or to the ground line 20.

As shown in FIG. 1, the current source transistors 10.1, 10.2 and 10.3 for the three most significant bits have their emitter areas binarily scaled to provide uniform current density therein in accordance with the above-mentioned U.S. Pat. No. 3,747,088. The bases of current source transistors 10.1 through 10.3 are connected together and driven from a common base line 24 connected to the output of a control circuit 25. The control circuit 25 comprises an operational amplifier 26 which compares the current through a series-connected pair of reference transistors 28, 30 with a constant reference current developed by a reference voltage source 32 and a reference resistor 34, and continuously adjusts the base voltage of the reference transistor 30 to maintain the current through that transistor constant. This voltage control similarly maintains the current through the current source transistors 10.1 through 10.3 fixed as explained in the above-mentioned U.S. Pat. Nos. 3,685,045 and 3,747,088. As further explained in above-mentioned co-pending application Ser. No. 505,477, converter DA1 can function as a multiplying converter by varying the reference voltage 32 as one of the values to be multiplied, the other value being the digital input number. The magnitude of the reference voltage directly controls the magnitude of all of the bit currents correspondingly because the amplifier 26 sets the base voltage line 24 so that the bit currents track the reference current flowing through resistor 34.

In accordance with one aspect of the present invention, the current source transistors 10.3 through 10.8 have emitters with equal conductive areas and, because the currents carried by these transistors are in a binary weighting pattern, the transistors will operate at different current densities and different base-to-emitter voltages $V_{BE}$ when carrying the different levels of current. In accordance with the invention, the bases of successive current transistors 10.3 through 10.8 are interconnected through resistors R of, for example, 150 ohms, and a current generator 70 is connected through a current supply line 71 in series with the resistors R to send a current $I_T$ through the resistors R to develop across each one of them a voltage $\Delta V_{BE}$, varying with absolute temperature, corresponding to the difference between base-to-emitter voltages of successive current source transistors operated at current densities in a ratio of 2 to 1. As a result, the emitter voltages of the successive current source transistors 10.3 through 10.8 will be equal to one another and equal to the emitter voltages of transistors 10.1 and 10.2. Moreover, since the current $I_T$ through the resistors R varies with absolute temperature, the voltages $\Delta V_{BE}$ developed across resistors R will track the changes in transistor base-to-emitter voltage $V_{BE}$ with temperature, and the emitter voltages will remain stable with respect to temperature to provide accurate levels of weighted current in the converter and accurate digital-to-analog conversion.

Turning now to the structure of current generator 70 in detail, the generator is connected between the current supply line 71 extending to the series of interbase resistors R and the negative power supply line 72. First and second NPN transistors 74 and 76 have their bases connected together and have emitter areas provided in the ratio of 1:2, and a regeneratively coupled transistor circuit 78 is arranged to force equal currents through the transistors 74, 76 to a summing point 80. A resistor 82, having a resistance value of 2R, or 300 ohms, is connected between the emitters of transistors 74 and 76 and is arranged to carry the current through transistor 76, which is operating at the lower current density, to summing point 80. The base-to-emitter voltage difference $\Delta V_{BE}$ between transistors 74 and 76 appears across emitter resistor 82 and forces a current through it of $\Delta V_{BE}/2R$. An equal current flows through transistor 74 in the opposite side of the circuit so that the sum current $I_T$ is given by $$I_T = \Delta V_{BE}/R$$

When the current $I_T$ passes through the interbase resistors R positioned between current source transistors 10.3 through 10.8. there will be developed across each resistor R a voltage of $I_T \times R = \Delta V_{BE}$, which is the desired base-to-emitter voltage difference associated with a 2:1 current density ratio. This voltage varies linearly with absolute temperature according to the following expression $$\Delta V_{BE} = \frac{kT}{q} \ln 2$$

where T is the absolute temperature of transistors 74, 76 in degrees Kelvin, k is Boltsman's constant and $q$ is the electron charge.

The transistor circuit 78 which forces equal currents through transistors 74 and 76 is formed with a balanced pair of PNP transistors 84, 86, complementary in type to the transistors 74, 76. Transistors 84, 86 have their emitters connected together and to the current supply line 71, have their bases connected together, and have their collectors connected respectively to the collectors of transistors 74 and 76. As shown in FIG. 1, transistor 86 has its base and collector connected, as does transistor 74. The foregoing arrangement provides a current mirror which will cause the loop to be regenerative when the collector current of transistor 76 is less than that of transistor 74, so that the currents through both collectors will increase until the currents are equal and the loop gain is 1.

Current generator 70 has a stable "off" state and thus is provided with a starting circuit 88 to cause current to begin flowing in the transistors so that regenerative operation will begin. The starting circuit 88, as illustrated, comprises a pinch resistor 90 connected to the bases of transistors 74, 76 and connected through the base-to-emitter circuit of an NPN transistor 92 to the negative power supply line 72. A current of about 3 microamperes flows through the starting circuit 88 to begin regenerative operation. A typical value of current $I_T$ is about 0.12ma, which is not seriously affected by the current flowing through starting circuit 88.

In addition to the current $I_T$, it will be observed that the base currents of the current source transistors 10.4 through 10.8 will add to the total current flowing through interbase resistors R and will be most significant in the higher order bits. The effect of these base currents is small, however, and can be compensated by adjusting the values of the interbase resistors R to be slightly smaller near the higher order bits. One technique for accomplishing compensation is to use paralleled pinched base resistors for the interbase resistors R, since such resistors have a value which varies with $h_{FE}$ and hence can be selected to compensate for base current.

Figure 2:
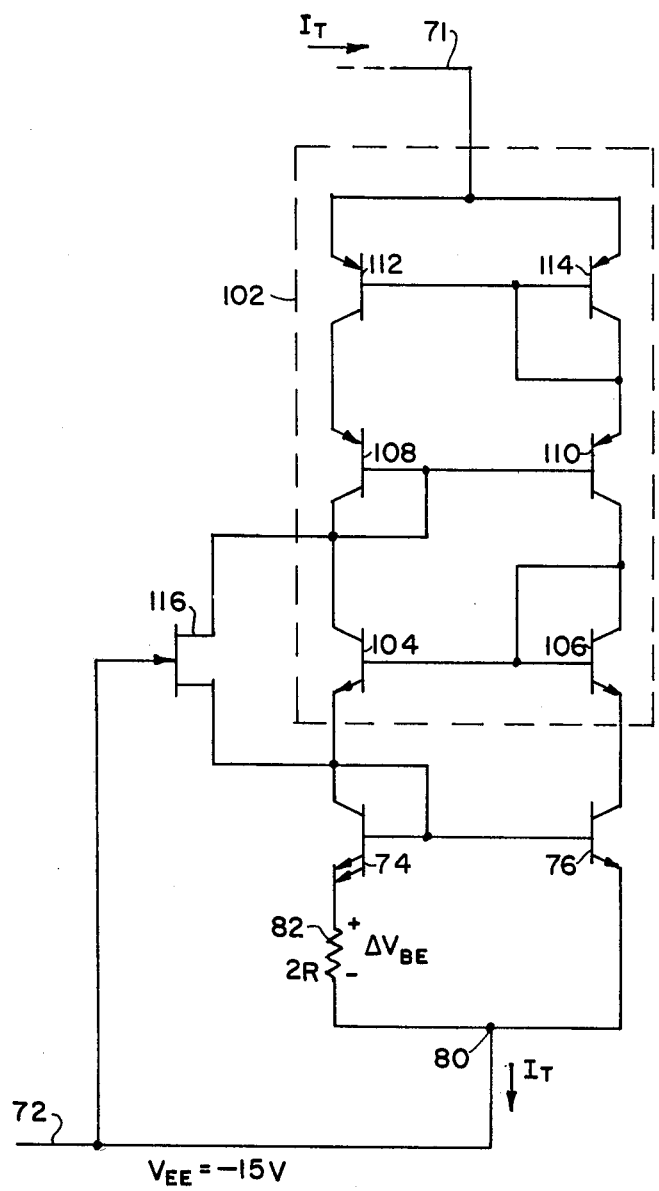
FIG. 2 is a schematic diagram illustrating another current generator suitable for the converter.

FIG. 2 illustrates another current generator 100 which, like current generator 70, is to generate a current $I_T$ varying linearly with absolute temperature and comprises first and second transistors 74, 76 with emitter areas in the ratio of 1 to 2, and an emitter resistor 82 having a value of 2R. Equal currents are forced through transistors 74 and 76 by means of a regeneratively coupled transistor circuit 102 which is capable of more accurate operation in forcing equal currents than the circuit 78 in current generator 70. The transistor circuit 102, as shown, comprises a first balanced pair of NPN transistors 104, 106, a second balanced pair of PNP transistors 108, 110, and a third pair of balanced PNP transistors 112, 114. The emitters of transistors 112, 114 are connected to current supply line 71, and the three pairs of transistors are regeneratively coupled as shown to cause the currents flowing in the two sides of the circuit to become equal. A starting current is supplied by an FET transistor 116 having its gate connected to the negative power supply line 72 and having its source and drain connected across the collector-to-emitter circuit of transistor 104. The FET transistor 116 permits a controlled current leakage sufficiently large to start the circuit, but small enough so that it does not seriously affect the desired operation of the circuit once it begins regenerative operation. Current generator 100 supplies a current $I_T$ given by $$I_T = \frac{\Delta V_{BE}}{R} = \frac{kT}{q} \ln 2$$

The current produced by generator 100 is very linearly proportional to temperature, and achieves good temperature performance in a digital-to-analog converter.

Accordingly, the use of interbase resistors R together wigh generator 70 or 100 allows current source transistors with uniform emitter areas, such as 10.3 through 10.8, to be effectively used in a digital-to-analog converter without losing accuracy due to temperature drift. This characteristic is particularly valuable since the means to achieve it is fully compatible with switching cells 14, base voltage control 25 with its multiplying ability, and even with current source transistors having weighted emitter areas, such as transistors 10.1 through 10.3. It should further be noted that since the invention allows some or all of the current source transistors to have uniform emitter areas, substantial savings can be made in the amount of IC chip area that is required for a converter.

Although specific preferred embodiments of the invention have been described hereinabove in detail, it is desired to note that this is for the purpose of illustrating the invention, and should not be construed as necessarily limiting of the invention, since it is apparent that those skilled in this art will be able to modify the form of the invention in many ways to meet the requirements of different applications.

I claim:

1. An apparatus for generating a current varying linearly with absolute temperature, comprising:
   first and second transistors each comprising a base, an emitter and a collector, said transistors having conductive areas of different sizes;
   means in the form of at least one regeneratively coupled transistor pair connected to the collectors of the first and second transistors for forcing equal currents through the first and second transistors to operate them at different current densities, thereby to produce different base-to-emitter voltages in the first and second transistors; and means responsive to the difference in the base-to-emitter voltages of the first and second transistors for developing a current corresponding to the difference in base-to-emitter voltages.

2. Apparatus for generating a current as claimed in claim 1 wherein the means responsive to the difference in the base-to-emitter voltages of the first and second transistors comprises a resistance connected between the emitters of the first and second transistors and arranged to carry the current through the one of the first and second transistors operating at the lower current density.

3. Apparatus for generating a current as claimed in claim 2 wherein the currents of the first and second transistors are summed to form the current varying linearly with absolute temperature.

4. Apparatus for generating a current as claimed in claim 1 wherein the first and second transistors have conductive areas in the ratio of 2:1.

5. Apparatus for generating a current as claimed in claim 1 wherein the first and second transistors have their bases connected together, and the means responsive to the difference in base-to-emitter voltages of the first and second transistor comprises a resistance connected between the emitters of the first and second transistors and arranged to carry the current through the one of the first and second transistors operating at the lower current density.

6. Apparatus for generating a current as claimed in claim 1 wherein the means for operating the first and second transistors at equal currents comprises a pair of regeneratively coupled transistors having their bases interconnected and their emitters interconnected and being of a type complementary to the first and second transistors and being arranged to supply currents to the collectors of the first and second transistors.

7. Apparatus for generating a current as claimed in claim 6 wherein the one of the first and second transistors operating at the higher current density has its base connected to its collector and wherein the complementary transistor supplying current to the other of the first and second transistors has its base connected to its collector.

8. Apparatus for generating a current as claimed in claim 1 wherein the means for forcing equal currents through the first and second transistors comprises:

a first pair of transistors of the same type as the first and second transistors having their bases interconnected and arranged to supply currents through their emitters to the collectors of the first and second transistors;

a second pair of transistors of a type complementary to the first and second transistors and having their bases interconnected and arranged to supply currents through their collectors to the collectors of the first pair of transistors; and a third pair of transistors of a type complementary to the first and second transistors and having their bases interconnected and their emitters interconnected, and arranged to supply current through their collectors to the emitters of the second pair.

9. Apparatus for generating a current as claimed in claim 8 wherein the one of the first and second transistors operating at the higher current density has its base connected to its collector, and wherein alternating ones of the first, second, and third pairs of transistors have their bases connected to their collectors.

10. Apparatus for generating a current as claimed in claim 1 further comprising starting means for supplying a current to the regeneratively coupled transistors to begin regenerative operation.

11. A two-terminal semiconductive element to be connected to an external DC voltage source to produce through said two terminals a controlled current varying proportionately with absolute temperature of the semiconductive element, comprising:

first and second transistors each comprising a base, an emitter, and a collector, said transistors having conductive areas of preselected sizes;

circuit means coupling each of said transistors to both of said terminals to provide for the development of said controlled current flowing from said external voltage source through said terminals to both of said transistors;

said circuit means including first means activated by said controlled current and coupled to at least one of said transistors for maintaining the relative magnitudes of the currents through said first and second transistors at a value which provides a predetermined ratio different from one between the current densities in the conductive areas of said transistors whereby the $\Delta V_{BE}$ of said two transistors is directly proportional to absolute temperature; and said circuit means including second means responsive to said $\Delta V_{BE}$ for maintaining the magnitude of said controlled current proportional to said $\Delta V_{BE}$ so that the current flowing through said two terminals is proportional to absolute temperature, said apparatus thereby being adapted to serve as a temperature transducer when connected at one end of a two-wire line supplied at its other end with DC power.

12. Apparatus as claimed in claim 11, wherein said circuit means is powered entirely by the flow of said controlled current.

* * * * *